United States Patent [19]
Chang et al.

[11] Patent Number: 5,442,748
[45] Date of Patent: Aug. 15, 1995

[54] ARCHITECTURE OF OUTPUT SWITCHING CIRCUITRY FOR FRAME BUFFER

[75] Inventors: Shuen C. Chang, San Jose; Hai D. Ho, Milpitas; Szu C. Sun, Mountain View; Jawii Chen, Cupertino, all of Calif.

[73] Assignees: Sun Microsystems, Inc., Mountain View; Samsung Semiconductor Inc., San Jose, both of Calif.

[21] Appl. No.: 145,754

[22] Filed: Oct. 29, 1993

[51] Int. Cl.⁶ ............................................. G06F 12/00
[52] U.S. Cl. .................................................. 395/164
[58] Field of Search ............................. 395/162–166, 395/250, 275, 425; 345/185–187, 189, 190, 197, 198, 200

[56] References Cited

U.S. PATENT DOCUMENTS

| | | | |
|---|---|---|---|
| 4,747,081 | 5/1988 | Heilveil et al. | 365/219 |
| 4,947,373 | 8/1990 | Yamaguchi et al. | 365/189.04 |
| 5,023,838 | 6/1991 | Herbert | 365/189.08 |
| 5,042,013 | 8/1992 | Sato | 365/230.05 |
| 5,170,157 | 12/1992 | Ishii | 340/799 |
| 5,249,159 | 9/1993 | Sato | 365/230.65 |
| 5,305,278 | 4/1994 | Inoue | 365/230.03 |

Primary Examiner—Raymond J. Bayerl
Assistant Examiner—U. Chauhan
Attorney, Agent, or Firm—Blakely Sokoloff Taylor & Zafman

[57] ABSTRACT

A frame buffer including a plurality of array planes of memory cells, row decoding circuitry for selecting rows of memory cells in each of the array planes to be accessed, column decoding circuitry for selecting columns of memory cells in each of the array planes to be accessed, a plurality of bitlines associated with the columns of memory cells of each array plane, each of the bitlines connecting to a column of memory cells and including a bitline sensing amplifier and a column select switch for providing access to the memory cells of that column of the array plane, a plurality of output sense amplifiers adapted to be connected to a selected number of bitlines in an array plane by closing of particular ones of the column select switches in the bitlines, first apparatus for providing output signals from the plurality of output sense amplifiers associated with each array plane to a data bus, and second apparatus for providing output signals from the plurality of output sense amplifiers associated with each array plane to a shift register.

20 Claims, 5 Drawing Sheets

ARCHITECTURE OF OUTPUT SWITCHING CIRCUITRY FOR FRAME BUFFER

BACKGROUND OF THE INVENTION

1. Field of the Invention

This invention relates to computer systems and, more particularly, to apparatus for transferring data from a memory array of a frame buffer to a shift register used to provide data to an output display device.

2. History of the Prior Art

One of the significant problems involved in increasing the operational speed of desktop computers has been in finding ways to increase the rate at which information is transferred to an output display device. Many of the various forms of data presentation which are presently available require that copious amounts of data be transferred. For example, if a computer output display monitor is operating in a color mode in which 1024×780 pixels are displayed on the screen at once and the mode is one in which thirty-two bits are used to define each pixel, then a total of over twenty-five millions bits of information must be transferred to the screen with each individual picture (called a "frame") that is displayed. Typically, sixty frames are displayed each second so that over one and one-half billion bits must be transferred each second in such a system. This requires a very substantial mount of processing power.

In order to provide such a large amount of information to an output display device, computer systems typically utilize a frame buffer which holds the pixel data which is to be displayed on the output display.

Typically a frame buffer offers a sufficient amount of dynamic random access memory (DRAM) to store one frame of data to be displayed. The information in the frame buffer is transferred to the display from the frame buffer sixty or more times each second. After (or during) each transfer, the pixel data in the frame buffer is updated with the new information to be displayed in the next frame. Prior art frame buffers capable of holding the necessary amount of information are quite large and complicated.

In fact, a number of operations which might help to increase the speed of operation of a frame buffer and the transfer of the data in the frame buffer to the output display device are not implemented because the mount of circuitry required is too extensive and too complicated to be economic.

For example, transferring the data to and from the frame buffer is very slow because of the manner in which the frame buffers are constructed. Various improvements have been made to speed access in frame buffers. For example, two-ported video random access memory (VRAM) has been substituted for dynamic random access memory so that information may be transferred from the frame buffer to the display at the same time other information is being loaded into the frame buffer.

One of the problems which all frame buffers have faced is caused by the method by which data is transferred from the frame buffer to an output display device. Typically, the display device is a cathode ray tube which renders the pixel data stored in the frame buffer on a screen in a series of rows. A typical display is comprised of 780 horizontal rows, each of which includes as many as 1024 individual pixels. A frame is described on the display by writing individual rows of pixels starting at the upper left corner of the display. Each row of pixels is rendered from left to right across the display before a next row in sequence is begun, When a row is completed, the next row below is begun at the left side of the screen. Each row is rendered in order until the last row at the bottom of the screen is completed. This completes one frame. Then the process starts over from the beginning with the next frame at the upper left corner of the display. As explained above, in the typical display sixty individual frames are presented each second.

In order to cause each of the pixels stored in the frame buffer to be presented at the appropriate position on the display, it is necessary to read the data for each pixel and transfer that data to the circuitry which controls its rendering on the output display device. In a typical VRAM, the pixel data to be displayed is read a row at a time and placed in a shift register at the output of the frame buffer. This is accomplished by providing one stage of shift register memory for each column of the array and writing into the shift register in response to a row selection accomplished by the row decode signal. The data stored at each cell of the row is amplified by a bitline sense amplifier for that column and transferred to the associated shift register stage. The data is then available in the shift register so that it may be shifted to the display a pixel at a time in order to fit the above-described sequence in which the pixels of a frame are displayed on a display device.

Such a prior art shift register stores an entire row of pixel data stored in the array of the frame buffer. Such a shift register size has always been necessary because of the architectural arrangement by which a stage of the output shift register is associated with each column of the array. However, to hold this mount of data such a shift register must be capable of holding the number of pixels in a row multiplied by the largest number of bits in a pixel. For thirty-two bit color displays having a size of 512×512 pixels, this requires a shift register capable of holding 512×32 or a total of over sixteen thousand bits. A shift register capable of storing this amount of data and the attendant circuitry for transferring the data from the frame buffer array to the shift register require a very substantial amount of die space. Moreover, the pixel data stored by such a shift register must further amplified before it is furnished to the display control circuitry because the bitline sense amplifiers do not provide a sufficient amount of amplification. This addition amplification slows the operation of writing to the display.

It has now been determined that such a large shift register is unnecessary for providing sufficient data to keep up with the display of pixel data on an output display device. It is therefore desirable to provide an architecture which allows the size of the shift register to be reduced in order to reduce the complexity and expense of frame buffer circuitry. It is also desirable to provide a more rational arrangement of circuit architecture for transferring data from a frame buffer array to a shift register used for furnishing pixel data to an output display device.

SUMMARY OF THE INVENTION

It is, therefore, an object of the present invention to provide a new design of circuitry for providing output from a frame buffer.

It is another more specific object of the present invention to provide a new design of output circuitry for switching pixel data from a frame buffer to an output display device which output circuitry is reduced in size and more capable in operation than prior art arrangements.

These and other objects of the present invention are realized in a frame buffer comprising a plurality of array planes of memory cells, row decoding circuitry for selecting rows of memory cells in each of the array planes to be accessed, column decoding circuitry for selecting columns of memory cells in each of the array planes to be accessed, a plurality of bitlines associated with the columns of memory cells of each array plane, each of the bitlines connecting to a column of memory cells and including a bitline sensing amplifier and a column select switch for providing access to the memory cells of that column of the array plane, a plurality of output sense amplifiers adapted to be connected to a selected number of bitlines in an array plane by closing of particular ones of the column select switches in the bitlines, a first means for providing output signals from the plurality of output sense amplifiers associated with each array plane to a data bus, and a second means for providing output signals from the plurality of output sense amplifiers associated with each array plane to a shift register.

These and other objects and features of the invention will be better understood by reference to the detailed description which follows taken together with the drawings in which like elements are referred to by like designations throughout the several views.

NOTATION AND NOMENCLATURE

Some portions of the detailed descriptions which follow are presented in terms of symbolic representations of operations on data bits within a computer memory. These descriptions and representations are the means used by those skilled in the data processing arts to most effectively convey the substance of their work to others skilled in the art. The operations are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like. It should be borne in mind, however, that all of these and similar terms are to be associated with the appropriate physical quantities and are merely convenient labels applied to these quantities.

Further, the manipulations performed are often referred to in terms, such as adding or comparing, which are commonly associated with mental operations performed by a human operator. No such capability of a human operator is necessary or desirable in most cases in any of the operations described herein which form part of the present invention; the operations are machine operations. Useful machines for performing the operations of the present invention include general purpose digital computers or other similar devices. In all cases the distinction between the method operations in operating a computer and the method of computation itself should be borne in mind. The present invention relates to a method and apparatus for operating a computer in processing electrical or other (e.g. mechanical, chemical) physical signals to generate other desired physical signals.

DETAILED DESCRIPTION OF THE INVENTION

Figure 1:
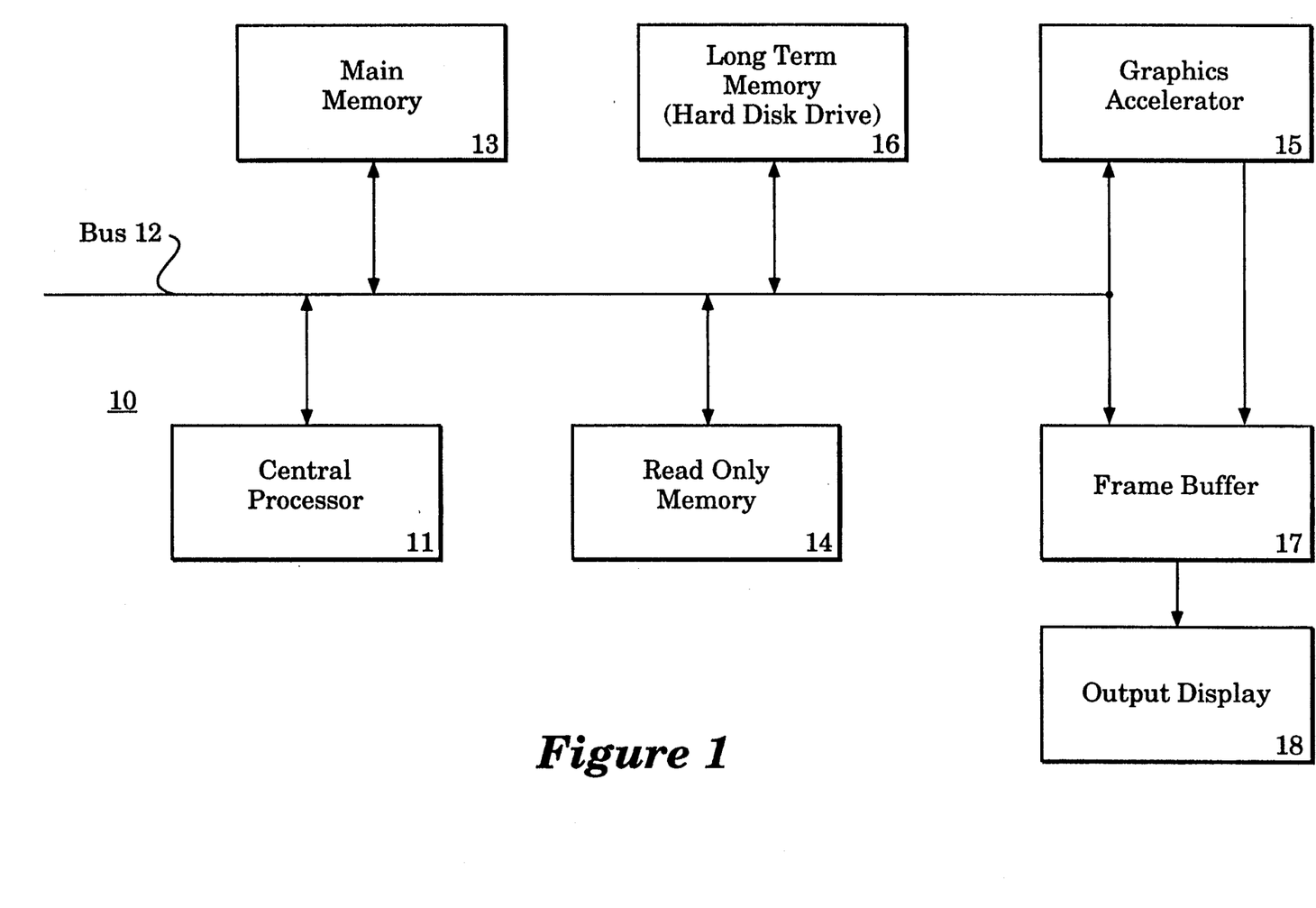
FIG. 1 is a block diagram illustrating a computer system which may include the present invention.

Referring now to FIG. 1, there is illustrated a computer system 10. The system 10 includes a central processor 11 which carries out the various instructions provided to the computer 10 for its operations. The central processor 11 is joined to a bus 12 adapted to carry information to various components of the system 10. Also connected to the bus 12 is main memory 13 which is typically constructed of dynamic random access memory arranged in a manner well known to those skilled in the prior art to store information being used by the central processor during the period in which power is provided to the system 10. A read only memory 14 which may include various memory devices (such as electrically programmable read only memory devices (EPROM)) well known to those skilled in the art which are adapted to retain a memory condition in the absence of power to the system 10. The read only memory 14 typically stores various basic functions used by the processor 11 such as basic input/output and startup processes.

Also connected to the bus 12 are various peripheral components such as long term memory 16. The construction and operation of long term memory 16 (typically an electro-mechanical hard disk drive) are well known to those skilled in the art. Also coupled to the bus 12 is circuitry such as a frame buffer 17 to which data may be written which is to be transferred to an output device such as a monitor 18 for display. For the purposes of the present explanation, the frame buffer 17 may be considered to include in addition to various memory planes necessary to store information, various circuitry well known to those skilled in the art such as addressing circuitry, sensing amplifiers, color lookup tables (where color indexing is utilized), digital-to-analog converter circuitry, and circuitry for controlling the scan of information to the output display. In addition, the frame buffer 17 may be connected to the bus 12 through circuitry such as graphic accelerating circuit 15 used for providing fast rendering of graphical data to be furnished to the frame buffer 17.

Figure 2:
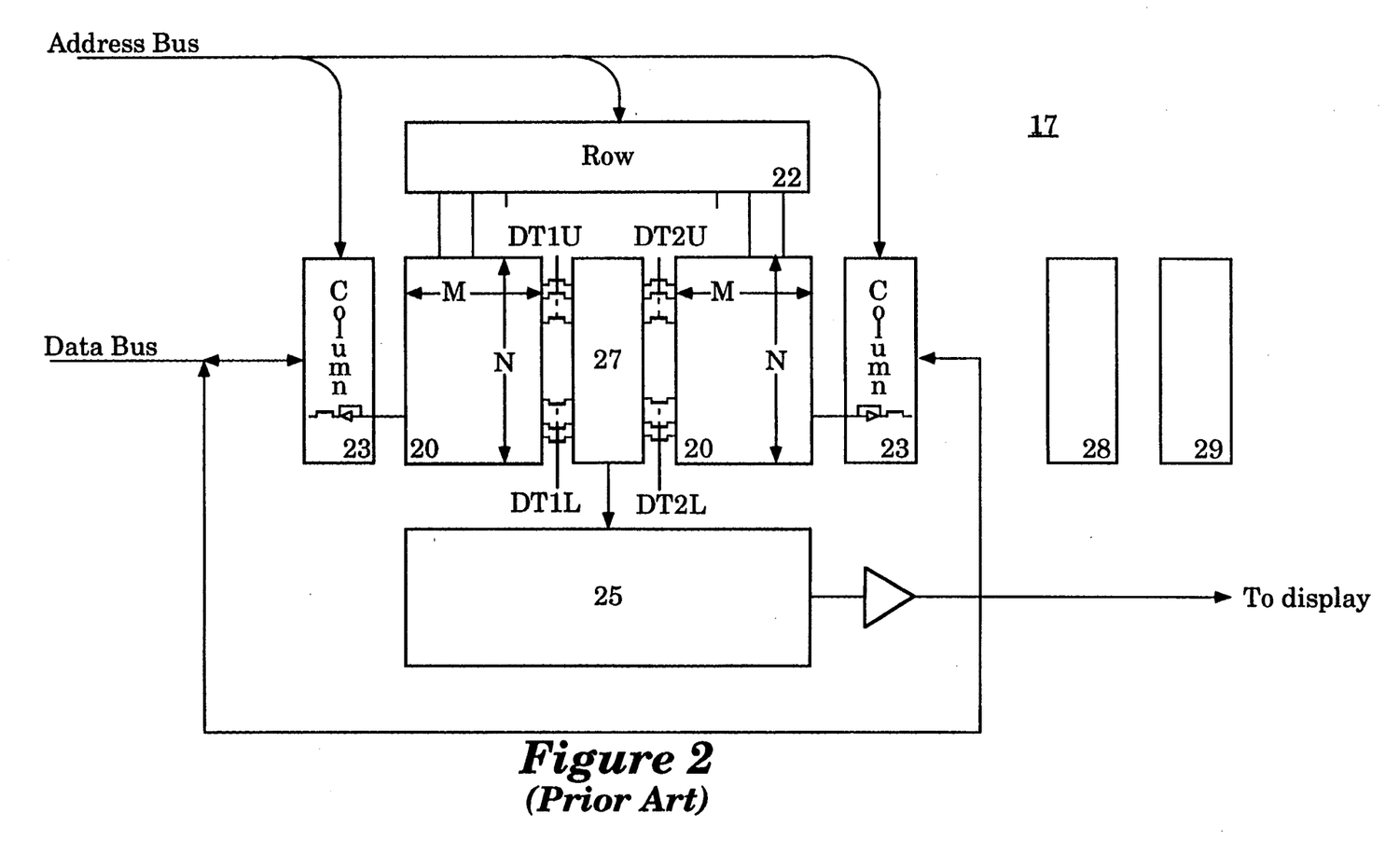
FIG. 2 is a block diagram illustrating a frame buffer designed in accordance with the prior art.

FIG. 2 illustrates a frame buffer 17 constructed in accordance with the prior art. Typically, such a frame buffer 17 includes a dynamic random access memory array 20 designed to store information defining pixels on the output display. Such an array 20 may be designed to provide two ports so that information may be read from the array during a period in which information is being written to the array. An array 20 so constructed is referred to as video random access memory or VRAM.

Typically, pixel data is transferred to the array 20 in a binary pattern. In a typical computer system having a thirty-two bit data bus portion of the bus 12, thirty-two bits of information may be written to the frame buffer memory and appear at thirty-two input pins. This data may define one or more pixels depending upon the number of bits required to define a pixel in the particular mode of operation. This pixel data is transferred to memory addresses within the array 20 from which it may later be retrieved for display. The positions to which the pixel data is transferred within the array are designated by addresses transferred to the array on an address bus.

Typically, the pixel data is transferred to the frame buffer on the data bus portion of the bus 12, and the address for that data is transferred on the address bus portion of the bus 12. The address includes a row address portion and a column address portion. These portions of the address are decoded by row and column address decoding circuits 22 and 23, respectively. The selected row and column identify a specific memory cell so that a bit of data may be written to that selected position. If data defining an individual pixel is more than one bit (four, eight, sixteen, or thirty-two bits of color data), then the address typically identifies a plurality of positions within the array 20 (often in individual planes of the array) in which the bits defining one or more pixels are to be stored. Data stored in the frame buffer 17 may be read from the array 20 on the data bus by addressing the appropriate pixel position using the row and column addresses of the memory cells in the array and providing a read command. Such data may then be utilized within the computer system of which the frame buffer 17 is a part in accordance with instructions sent by, for example, a central processing unit. As may be seen, both writing to and reading from the frame buffer 17 require that the memory positions of the array be addressed.

Although data may be read from the array on the data bus, it is typical that the largest amount of information transferred from the array is pixel data transferred to an output display device such as the device 18 illustrated in FIG. 1. And although information being written to the array 20 of the frame buffer 17 tends to change in a somewhat varied manner because of the way data is furnished to a computer, data is typically being constantly transferred from the array 20 of the frame buffer 17 to the display in an orderly, row by row fashion. In order to allow pixel data to be written to the array while information is constantly being written to the output display device, a second output port apart from the system bus is used. This second output port includes a large shift register 25 having an individual shift register stage associated with each column of the array. Thus, a typical shift register 25 for transferring data to the display holds one entire row of bits of pixel data for each plane of the array 20. To load the shift register 25, an address designating a row is transferred to the frame buffer on the address bus and decoded. All of the memory cells in the row of the array addressed are read and written in parallel into the shift register 25 through the bitline sense amplifiers. This data is then shifted sequentially, pixel by pixel, out of the shift register 25 to the display. Then a next row address in sequence is received on the address bus from the unit controlling the transfer of the pixel data to the display. The pixel data in this next addressed row is read and written to the shift register 25 for transfer to the output display. This operation continues as long as information is being displayed. As will be understood, since the pixel data being transferred to the output display has been transferred from the frame buffer to the shift register in a single access, the operations of the frame buffer may be accelerated since new information may be written to the frame buffer while pixel data is being sequentially transferred from the shift register to the display. This also frees the data buses for purposes other than transferring the pixel data to the output display device 18.

FIG. 2 illustrates one well known prior art arrangement for providing individual ports for the data bus and for the output shift register. In the arrangement illustrated, each plane of the array 20 is divided into two individual halves. Similarly, the column address decoding circuitry is divided into two halves which are physically arranged outside of the memory cell portion of the array itself in each plane of the array. Each of the halves of the column decoding circuitry 23 includes bitline sensing amplifiers and switching circuitry for selecting the particular addressed columns in each operation practiced with respect to the array.

A series of column decoding switches 27 is positioned between the two halves of each plane of the array 20. The switches 27 provide the circuitry necessary to decode the addresses of the columns of the array which are to be transferred to the output shift register 25 for transfer to the output display device. In known embodiments, the circuitry 27 is adapted to switch pixel data from upper and lower halves of each of the two halves of the array 20. This arrangement is utilized in order to reduce the power required to read out the memory cells and to reduce the size of the circuitry 27. In order to accomplish this, a signal is provided to designate each of the four areas of the plane of the array from which data is being read. Thus one signal reads the upper left half of the plane, another reads the lower left half, a third reads the upper right half, while a fourth reads the lower right half.

Because each of the two halves of the column decode circuits 23 and the circuit 27 are directly adjacent to the array halves, it is necessary to provide redundant output circuitry for each of these sets of circuits in order to be able to build such circuits economically. Such redundant circuits 28 and 29 are illustrated in FIG. 2 to the right of the other circuitry of the frame buffer 17. In the case of the column decode circuitry, this redundant circuitry includes the column address decoding circuitry, the switches for selecting the columns, and the bitline sense amplifiers. The circuitry 27 for transferring pixel data to the shift register 25 includes decoding circuitry for selecting the proper portion of the row of the array to transfer to the shift register 25 and the actual switches for accomplishing this operation.

It will be understood by those skilled in the art that the redundant circuitry 28 and 29 for both the column decode circuitry 23 and the circuitry 27 and the large shift register 25 require very substantial areas of the frame buffer. These areas are expensive to manufacture and large in size. The areas are often so large that the completed circuitry will not easily fit within the restricted areas available in desktop and portable computers. Typical circuitry used to provide the necessary redundancy occupies approximately four percent of the total die space used for the frame buffer.

Figure 3:
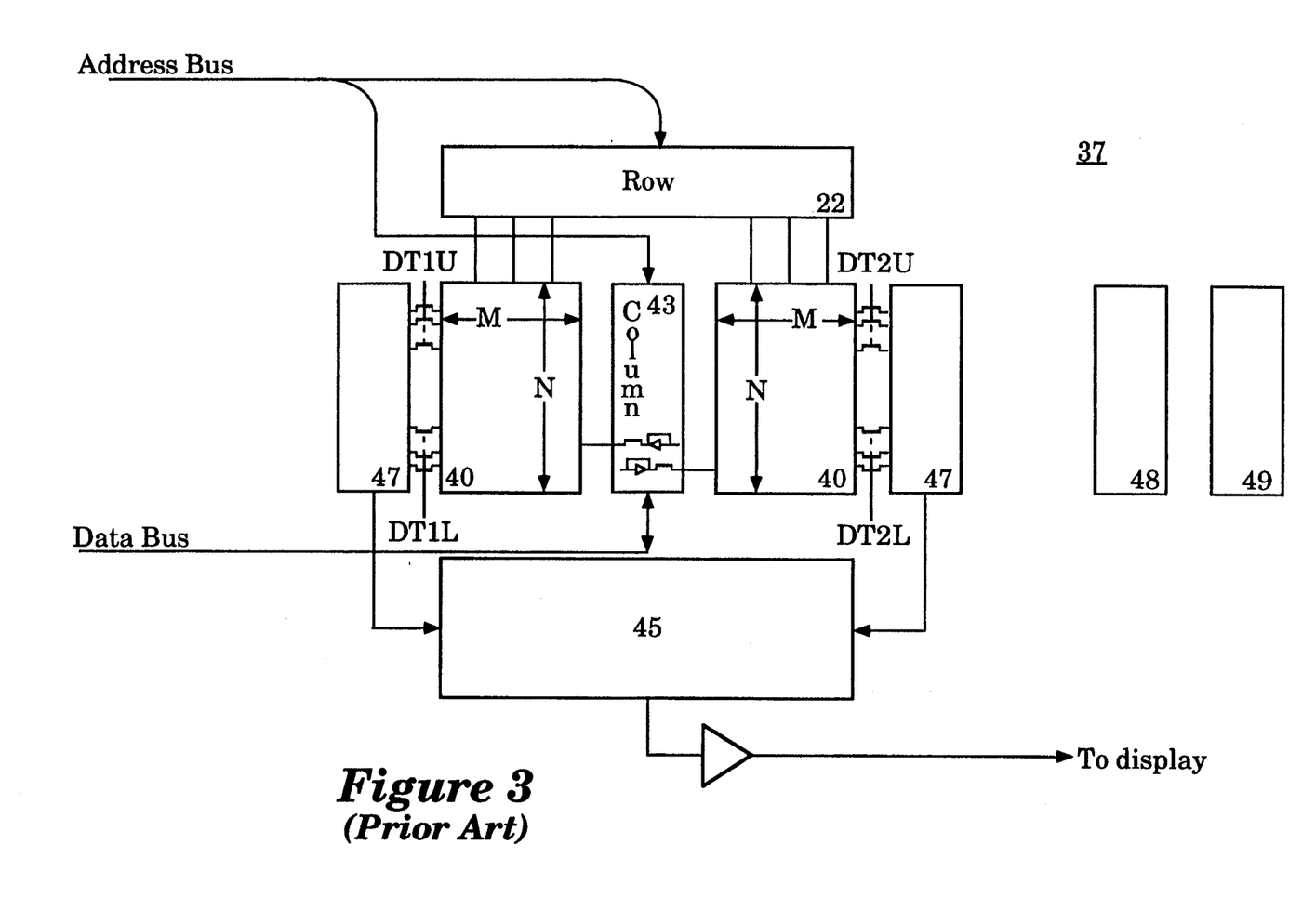
FIG. 3 is a block diagram illustrating another frame buffer designed in accordance with the prior art.

FIG. 3 is a block diagram of another frame buffer 37 designed in accordance with the teachings of the prior art. In the frame buffer 37 illustrated, the array 40 is divided into two halves in each plane as with the arrangement illustrated in FIG. 2. However, the column decode circuitry 43 and its associated bitline sense amplifiers, decoding circuits, and switches activated by the decoding circuitry are placed between the two halves 40 of the array. Since the center of the array is filled, the circuitry 47 for transferring pixel data to a shift register 45 is divided into two halves and placed outside the memory cells of the array 40. Again, the arrangement of FIG. 3 requires that redundant circuitry be provided for each of the column decode circuitry 43 and the shift register decoding circuitry 47. Typically, the amount of redundant circuitry is the same as the redundant circuitry needed for the arrangement of FIG. 2.

The present invention provides a new arrangement for transferring pixel data from a frame buffer to an output shift register.

Figure 4:
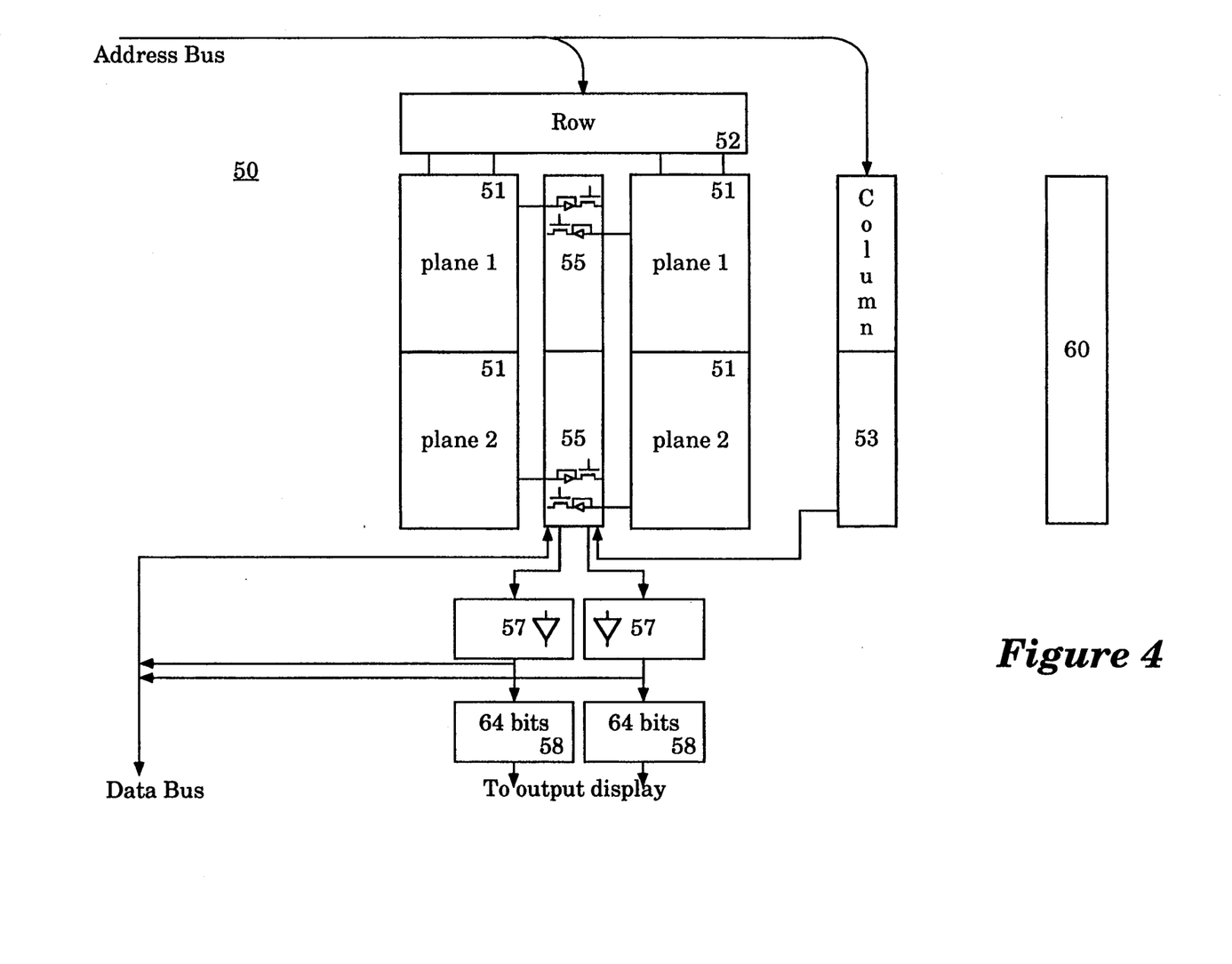
FIG. 4 is a block diagram illustrating an arrangement in accordance with the present invention.

Referring now to FIG. 4, there is illustrated a block diagram showing an architectural arrangement of a frame buffer 50 designed in accordance with the present invention. The frame buffer 50 includes first and second halves 51 of two planes of a memory array. Each of the halves 51 of each of the planes of the memory array 50 is accessed by means of addresses furnished on an address bus to a row decode circuit 52 and to a column decode circuit 53. The column decode circuit 53 furnishes signals to select particular columns to be accessed through the operation of column select gates and bitline sense amplifiers located in an area 55 centrally arranged between the two halves 51 of the array. The bitlines run from the area 55 separating the two halves 51 of the array to a plurality of column sense amplifiers 57. The figure includes a pair of groups of such column sense amplifiers arranged to sense the output of two individual planes of the array which are illustrated. From the output of the sense amplifiers, the data may be transferred to an output shift register 58 or to the data bus.

The output arrangement utilized by the frame buffer 50 to transfer pixel data from the memory array to the shift register 58 is thus the same circuitry used to transfer pixel data from the array to the data bus. Because the circuitry included in the area 55 provides output signals to both the shift register 58 and to the data bus, it is necessary to provide only a single set of redundancy circuits to correct imperfections in the manufacture of the array circuitry. This set of circuits 60 is illustrated to the right of the frame buffer in the figure. Because of this reduction in redundancy circuitry, this architecture substantially reduces the area required by each plane of the frame buffer memory array and reduces the cost thereof. In a preferred embodiment, the redundancy circuitry requires only one-half the die area required by the similar circuitry of the prior art.

In addition, this arrangement allows the stages of the shift register to be separated from the close association with the cells of the array at the output of the bitline sense amplifiers of each column because the shift register is placed at the output of the column sense amplifiers 57. It will be recognized by those skilled in the art that placing the shift register 58 at the output of the column sense amplifiers 57 where data appears only after being selected by the column decode circuitry means that less than an entire row of pixel data is transferred to the shift register 58 in any access. This means that there need not be one shift register stage for each column of the array. Because of this, the shift register 58 illustrated in the FIG. 4 is selected to provide only 64 bits of storage for each plane of the array, instead of the usual 512 bits of storage per plane. Thus, the die size required for the shift register is only one-eighth the size required by prior art shift registers. This also drastically reduces the size of the array and decreases its cost while providing a shift register of sufficient size to process the pixel data at an appropriate rate for the output display. Because of its position at the output of the column sense amplifiers, the shift register 58 receives pixel data with the full amplification provided by the column sense amplifiers and need not be further amplified when furnished to the display output circuitry. For this reason, the delay due to the additional output amplification in prior art circuits is eliminated.

Figure 5:
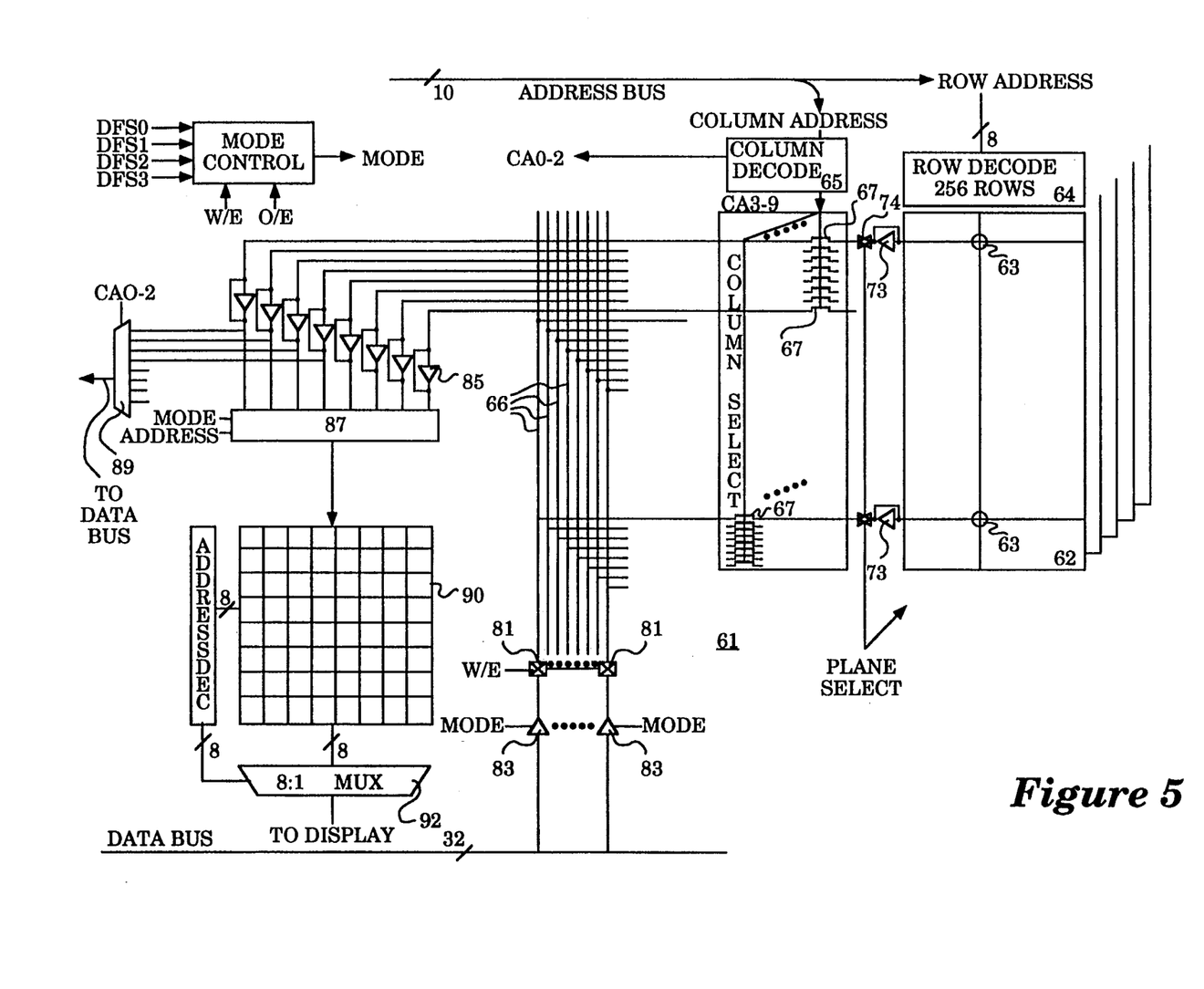
FIG. 5 is a circuit diagram showing a preferred embodiment of the present invention.

FIG. 5 is a circuit diagram showing a preferred embodiment of the invention. In FIG. 5, the various elements of the circuitry necessary to accomplish the type of physical layout illustrated in FIG. 4 are shown. However, the elements of FIG. 5 are not themselves arranged as they might be arranged in a specific physical arrangement. For example, although each plane of the array is typically divided into two halves which are separately addressed, only a single array of memory element is shown in FIG. 5 for each plane since to include both halves would make the circuitry very difficult to understand.

FIG. 5 shows a frame buffer 61 with a plurality of array planes 62 each having memory cells 63 arranged in row and column fashion. Row decode circuitry 64 receives row addresses while column decode circuitry 65 receives column addresses by which individual memory cells in each plane of the array are accessed. As may be seen, the row and column decode circuitry are positioned alongside the array planes 62. The column decode circuitry decodes column addresses and uses column select switches 67 to select among the particular columns for each access of the array. As may be seen, a series of plane select transmission gates 74 are used to select particular planes of the array to be accessed. Each switch 67 is joined in a column to a bitline sense amplifier 73. The bitline sense amplifier 73 is used to refresh the memory cells 63 of a selected row of the array and to write new data to the memory cells of the array.

Data is furnished to the cells of a selected row from a data bus shown as a 32 bit bus in the figure. As the frame buffer is optimized for eight bit color pixels, eight input conductors are shown connecting from a single one of the conductors of the data bus through eight write drivers 83 and eight write enable switches 81 to every eighth one of the bitlines of one plane of the array. Similar conductors, write drivers, and write enable switches connect each of the other conductors of the data bus to the bitlines in the other planes of the array.

Each of the bitlines in each plane may also be connected using the column select switches 67 to eight column select output amplifiers 85. The output amplifiers 85 furnish signals which may be transferred through a gating arrangement 87 to an output shift register 90. In a preferred embodiment of the invention, the arrangement 87 includes a plurality of transmission gates designed to transfer data from particular columns to particular positions in the shift register 90. Since only eight columns are transferred to the shift register at any access, the 64 bit positions of the shift register 90 are filled in a series of eight sequential accesses. Of course, this number would change with a different number of output amplifiers. A multiplexor 92 at the output of the shift register 90 allows the data in the shift register 90 to be transferred to the output display on a bit by bit per plane (pixel by pixel per array) basis. The output amplifiers 85 furnish signals which may also be transferred through a multiplexor 89 to the data bus. The lowest order bits of the column address are used to select the particular bits transferred to the bus from each plane of the array.

As may be seen, the arrangement disclosed in FIG. 5 requires only a single set of column select switches and bitline sense amplifiers to access the array in order to provide pixel data both to an output display device and to the data bus. This, of course reduces the actual amount of circuitry necessary to access the array. However, this architecture also significantly reduces the number of redundant circuits necessary in manufacturing to assure an economic product since redundant circuitry need not be duplicated for both the shift register and the data bus outputs as in the prior art.

In addition, the circuitry of the present invention significantly reduces the die size necessary to provide the shift register circuitry when compared to that required by the prior art. As may be seen, the shift register requires a die area able to store only one-eighth of a row of bits in the circuitry of the preferred embodiment as contrasted to a die area for the one or more rows of bits per plane necessary in prior art circuits.

Although the present invention has been described in terms of a preferred embodiment, it will be appreciated that various modifications and alterations might be made by those skilled in the art without departing from the spirit and scope of the invention. The invention should therefore be measured in terms of the claims which follow.

What is claimed is:

1. A frame buffer comprising
   an array plane of memory cells, each cell representing a bit position and holding a bit of data,
   row decoding circuitry coupled to the array plane of memory cells for selecting rows of memory cells in the array plane,
   column decoding circuitry coupled to the array plane of memory cells for selecting columns of memory cells in the array plane,
   a plurality of bitlines associated with the columns of memory cells of the array plane,
   each of the bitlines connecting to a column of memory cells and including a bitline sensing amplifier and a column select switch for providing access to the memory cells of that column of the array plane,
   a plurality of output sense amplifiers adapted to be connected to a selected number of bitlines in an array plane by closing of particular ones of the column select switches in the bitlines,
   a first switching circuit coupled to the output sense amplifiers for providing output signals from the plurality of output sense amplifiers associated with an array plane to a data bus, and a second switching circuit coupled to the output sense amplifiers for providing output signals from the plurality of output sense amplifiers associated with an array plane to a shift register.

2. A frame buffer as claimed in claim 1 further comprising an output shift register, the output shift register including a number of stages for storing pixel data from an array plane, the number of stages being less than the number of bit positions in a row of memory cells in the array plane.

3. A frame buffer as claimed in claim 2 in which the number of stages for storing pixel data of the output shift register is a multiple of the number of output sense amplifiers.

4. A frame buffer as claimed in claim 2 in which the number of stages for storing pixel data of the output shift register is sixty-four.

5. A frame buffer as claimed in claim 1 in which the first switching circuit for providing output signals from the plurality of output sense amplifiers associated with an array plane to a data bus comprises multiplexing means for transferring individual bits from individual columns of the array plane to a conductor of the data bus.

6. A frame buffer as claimed in claim 1 in which the second switching circuit for providing output signals from the plurality of output sense amplifiers associated with an array plane to a shift register includes a plurality of transmission gates for transferring from a plurality of columns to a plurality of shift register positions in each array plane simultaneously.

7. A frame buffer as claimed in claim 1 comprising
   a plurality of array planes, and
   row decoding circuitry, column decoding circuitry, bitlines, output sense amplifiers, a first switching circuit, and a second switching circuit associated with each of the plurality of array planes.

8. A frame buffer as claimed in claim 7 further comprising an output shift register,
   the output shift register including a number of stages associated with each array plane for storing pixel data from an array plane, the number of stages being less than the number of bit positions in a row of memory cells in the array plane.

9. A computer system comprising
   a central processing unit,
   main memory,
   a busing system including a data bus,
   an output display, and
   a frame buffer joining the busing system to the output display, the frame buffer comprising
   an array plane of memory cells, each cell representing a bit position and holding a bit of data,
   row decoding circuitry coupled to the array plane of memory cells for selecting rows of memory cells in the array plane,
   column decoding circuitry coupled to the array plane of memory cells for selecting columns of memory cells in the array plane,
   a plurality of bitlines associated with the columns of memory cells of the array plane,
   each of the bitlines connecting to a column of memory cells and including a bitline sensing amplifier and a column select switch for providing access to the memory cells of that column of the array plane,
   a plurality of output sense amplifiers adapted to be connected to a selected number of bitlines in an array plane by closing of particular ones of the column select switches in the bitlines,
   a first switching circuit coupled to the output sense amplifiers for providing output signals from the plurality of output sense amplifiers associated with each array plane to a data bus, and
   a second switching circuit coupled to the output sense amplifiers for providing output signals from the plurality of output sense amplifiers associated with each array plane to a shift register.

10. A computer system as claimed in claim 9 wherein the frame buffer further comprises an output shift register,
    the output shift register including a number of stages for storing pixel data from an array plane, the number of stages being less than the number of bit positions in a row of memory cells in the array plane.

11. A computer system as claimed in claim 10 in which the number of stages for storing pixel data of the output shift register is a multiple of the number of output sense amplifiers.

12. A computer system as claimed in claim 10 in which the number of stages for storing pixel data of the output shift register is sixty-four.

13. A computer system as claimed in claim 9 in which the first switching circuit for providing output signals from the plurality of output sense amplifiers associated with an array plane to a data bus comprises multiplexing means for transferring individual bits from individual columns of the array plane to a conductor of the data bus.

14. A computer system as claimed in claim 9 in which the second switching circuit for providing output signals from the plurality of output sense amplifiers associated with an array plane to a shift register includes a plurality of transmission gates for transferring from a plurality of columns to a plurality of shift register positions in each array plane simultaneously.

15. A computer system as claimed in claim 9 comprising
a plurality of array planes, and
row decoding circuitry, column decoding circuitry, bitlines, output sense amplifiers, a first switching circuit, and a second switching circuit associated with each of the plurality of array planes.

16. A computer system as claimed in claim 15 further comprising an output shift register,
the output shift register including a number of stages associated with each array plane for storing pixel data from an array plane, the number of stages being less than the number of bit positions in a row of memory cells in the array plane.

17. A frame buffer comprising
an array plane of memory cells in row and column alignment, each cell representing a bit position and holding a bit of data,
row decoding circuitry coupled to the array plane of memory cells for selecting rows of memory cells in the array plane,
column decoding circuitry coupled to the array plane of memory cells for selecting columns of memory cells in the array plane,
a plurality of bitlines each having a bitline sense amplifier associated with the memory cells of a column of the array plane,
each of the bitlines having a column select switch for providing access to the memory cells of that column of the array plane,
a plurality of output sense amplifiers adapted to be connected to a selected number of bitlines in an array plane by closing of particular ones of the column select switches in the bitlines,
an output shift register including a number of stages for storing pixel data from an array plane, the shift register being connected to receive output signals from the plurality of output sense amplifiers in an array plane.

18. A frame buffer as claimed in claim 17 in which the output shift register is not directly coupled to the array plane,
and in which the number of stages of the output shift register is less than the number of bit positions in a row of memory cells in the array plane.

19. A frame buffer as claimed in claim 18 in which the number of stages for storing pixel data of the output shift register is a multiple of the number of output sense amplifiers.

20. A frame buffer as claimed in claim 17 comprising
a plurality of array planes, and
row decoding circuitry, column decoding circuitry, bitlines, and output sense amplifiers associated with each of the plurality of array planes.

* * * * *

UNITED STATES PATENT AND TRADEMARK OFFICE
CERTIFICATE OF CORRECTION

PATENT NO. : 5,442,748
DATED : August 15, 1995
INVENTOR(S) : Chang et al.

It is certified that errors appear in the above-identified patent and that said Letters Patent is hereby corrected as shown below:

In column 1 at line 46, please delete " mount " and insert -- amount --.

In column 2 at line 34, please delete " mount " and insert -- amount --.

Signed and Sealed this

Third Day of December, 1996

Attest:

BRUCE LEHMAN

*Attesting Officer*          *Commissioner of Patents and Trademarks*

UNITED STATES PATENT AND TRADEMARK OFFICE
CERTIFICATE OF CORRECTION

PATENT NO. : 5,442,748
DATED : August 15, 1995
INVENTOR(S) : Chang et al.

It is certified that error appears in the above-indentified patent and that said Letters Patent is hereby corrected as shown below:

On the title page: Item [54] and Column 1, line 2, please delete " FOR FRAME " and insert -- FOR A FRAME --.

Signed and Sealed this

Fourth Day of March, 1997

Attest:

BRUCE LEHMAN

*Attesting Officer*      *Commissioner of Patents and Trademarks*